United States Patent [19]

Koike

[11] Patent Number: 4,609,836
[45] Date of Patent: Sep. 2, 1986

[54] CMOS TRANSMISSION CIRCUIT

[75] Inventor: Hideharu Koike, Yokohama, Japan

[73] Assignee: Kabushiki Kaisha Toshiba, Japan

[21] Appl. No.: 621,084

[22] Filed: Jun. 15, 1984

[30] Foreign Application Priority Data

Aug. 31, 1983 [JP] Japan ................... 58-159300

[51] Int. Cl.$^4$ ................... H03K 19/017; H03K 17/04; H03K 17/687
[52] U.S. Cl. ................... 307/451; 307/450; 307/581; 307/585; 307/270
[58] Field of Search ............... 307/448, 450, 451, 550, 307/555, 568, 246, 270, 584, 585, 581

[56] References Cited

U.S. PATENT DOCUMENTS

| | | | |
|---|---|---|---|
| 3,651,340 | 3/1972 | Cliff | 307/451 |
| 3,855,549 | 12/1974 | Heuner et al. | 307/451 X |
| 3,984,703 | 10/1976 | Jorgensen | 307/451 X |
| 4,122,360 | 10/1978 | Kawagai et al. | 307/450 X |
| 4,532,439 | 7/1985 | Koike | 307/450 |

FOREIGN PATENT DOCUMENTS 142061 5/1979 Japan ................... 307/451

OTHER PUBLICATIONS

Yamaga et al., "Industrial Use CMOS IC"; *Toshiba Review* No. 95, Jan-Feb. 1975; pp. 20-25.

*Primary Examiner*—Larry N. Anagnos
*Attorney, Agent, or Firm*—Finnegan, Henderson, Farabow, Garrett & Dunner

[57] ABSTRACT

A CMOS transmission circuit is proposed wherein there are provided first and second transmission lines, first and second MOSFETs of opposite conductivity types which are controlled in response to an input signal and are arranged at the start points of the first and second transmission lines, and third and fourth MOSFETs serving as level shifters arranged at the end points of the first and second transmission lines, so that a high level output is obtained through the first MOSFET, the first transmission line and third MOSFET, and a low level output is obtained through the second MOSFET, the second transmission line and the fourth MOSFET, thereby decreasing the voltage amplitudes at the first and second transmission lines.

14 Claims, 9 Drawing Figures

CMOS TRANSMISSION CIRCUIT

BACKGROUND OF THE INVENTION

The present invention relates to a CMOS transmission circuit used to drive a bus line arranged in a MOS-LSI.

A CMOS inverter 1 is used in a conventional CMOS (complementary metal oxide semiconductor) transmission circuit, as shown in FIG. 1. The source of an n-channel enhancement type MOSFET (metal-oxide-semiconductor field-effect transistor to be referred to as a MOS transistor for brevity hereafter) TN is connected to the ground (Vss). The drain of the MOS transistor TN is connected to the drain of a p-channel enhancement type MOS transistor TP. The source of the MOS transistor TP is connected to a power supply terminal 2 (Vcc). The gates of the MOS transistors TP and TN are connected to an input terminal 1a. The common drain node of the MOS transistors TP and TN is connected to a start point of a transmission line 3. The end point of the transmission line 3 is connected to an output terminal 1b. An input signal IN, supplied to the input terminal 1a, is inverted and amplified by the inverter 1, thereby obtaining an output signal OUT at the output terminal 1b. A capacitance C between the transmission line 3 and ground is a parasitic capacitance of the transmission line 3.

In this conventional CMOS transmission circuit having the arrangement described above, when an input signal voltage Vin changes in the range of Vcc to Vss (0 V), the voltage at the transmission line 3 changes by a corresponding magnitude within the range of Vss (0 V) to Vcc, and the parasitic capacitance C is usually very large. Therefore, a great number of carriers must be charged/discharged through the MOSFET TP or TN, and the drive capacity of the CMOS inverter 1 must be preset to be large. For this reason, high-speed signal transmission cannot be performed, and power consumption is increased.

SUMMARY OF THE INVENTION

It is, therefore, an object of the present invention to provide a CMOS transmission circuit which achieves high-speed signal transmission with low power consumption.

According to an aspect of the present invention, there is provided a CMOS transmission circuit comprising: an input terminal which receives an input signal; a first voltage source; a second voltage source; a first MOSFET of a first conductivity type which has a gate connected to the input terminal, one terminal being connected to the first voltage source, and the other terminal; a second MOSFET of a second conductivity type which has a gate connected to the input terminal, one terminal being connected to the second voltage source, and the other terminal; a first transmission line which has a start point, connected to the other terminal of the first MOSFET, and an end point; an output terminal for generating an output signal; first reference voltage generating circuit for generating a first reference voltage; a third MOSFET of the first conductivity type which has one terminal connected to the end point of the first transmission line, the other terminal connected to the output terminal, and a gate which receives the first reference voltage generated by the first reference voltage generating circuit; a second transmission line which has a start point, connected to the other terminal of the second MOSFET, and an end point; second reference voltage generating circuit for generating a second reference voltage; and a fourth MOSFET of the second conductivity type which has one terminal connected to the end point of the second transmission line, the other terminal connected to the output terminal, and a gate which receives the second reference voltage generated by the second reference voltage generating circuit.

According to this arrangement, high-speed signal transmission and low power consumption can be accomplished.

DETAILED DESCRIPTION OF THE PREFERRED EMBODIMENTS

Figure 1:
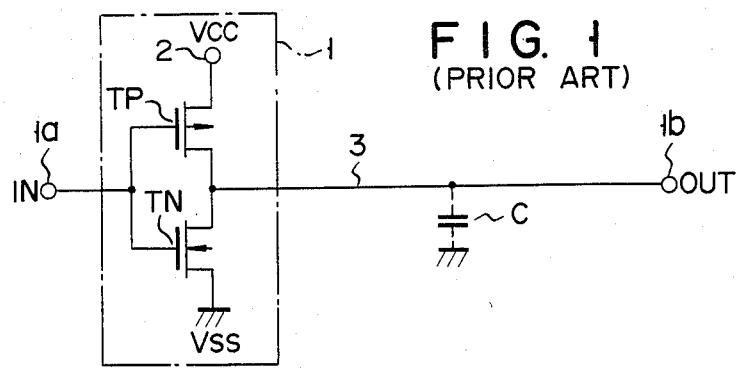
FIG. 1 is a circuit diagram of a conventional CMOS transmission circuit.
Figure 2:
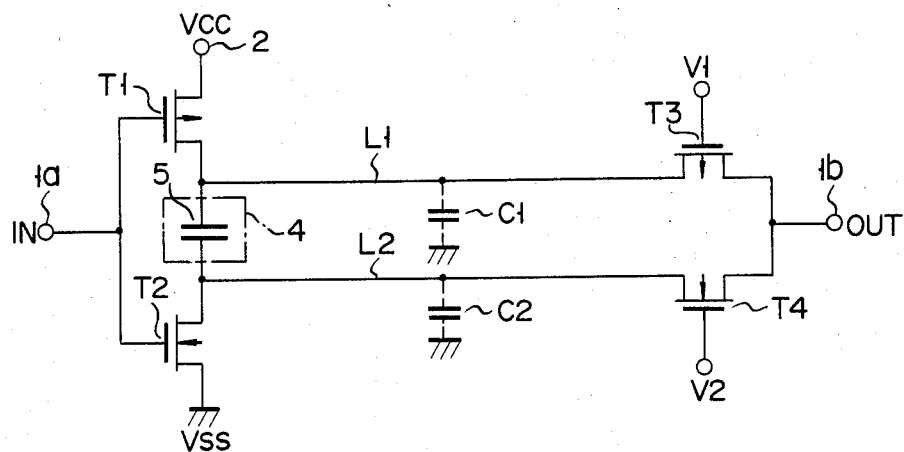
FIG. 2 is a circuit diagram of a CMOS transmission circuit according to an embodiment of the present invention.

FIG. 2 shows a CMOS transmission circuit according to an embodiment of the present invention. The source of a p-channel enhancement type first MOS transistor T1 is connected to a power supply terminal 2 which receives a power supply voltage Vcc. The gate of the MOS transistor T1 is connected to an input terminal 1a which receives an input signal IN. The drain of the MOS transistor T1 is connected to the start point of a first transmission line L1 and to one electrode of a capacitor 5 serving as a constant voltage circuit 4. The other electrode of the capacitor 5 is connected to the drain of an n-channel enhancement type second MOS transistor T2 and the start point of a second transmission line L2. The source of the MOS transistor T2 is grounded (Vss), and the gate thereof is connected to the input terminal 1a. The end point of the first transmission line L1 is connected to the source of a p-channel enhancement type third MOS transistor T3. The gate of the MOS transistor T3 receives a first reference voltage V1 and can be rendered conductive in response thereto. The drain of the MOS transistor T3 is connected to an output terminal 1b at which an output signal OUT appears. The end point of the second transmission line L2 is connected to the source of an n-channel enhancement type fourth MOS transistor T4. The gate of the MOS transistor T4 receives a second reference voltage V2 and can be rendered conductive in response thereto. The drain of the MOS transistor T4 is connected to the output terminal 1b. It should be noted that reference symbols C1 and C2 denote parasitic capacitances of the first and second transmission lines L1 and L2, respectively. The third and fourth transistors T3 and T4 serve as voltage limiting transistors. The first and second reference voltages V1 and V2 are preset so as to satisfy inequalities (1) and (2) as follows:

$$0 < V1 + |VTP3| < Vcc \quad (1)$$

$$0 < V2 - VTN4 < Vcc \quad (2)$$

where VTP3 is the threshold voltage of the p-channel third MOS transistor T3, and VTN4 is the threshold voltage of the n-channel fourth MOS transistor T4.

Figure 3:
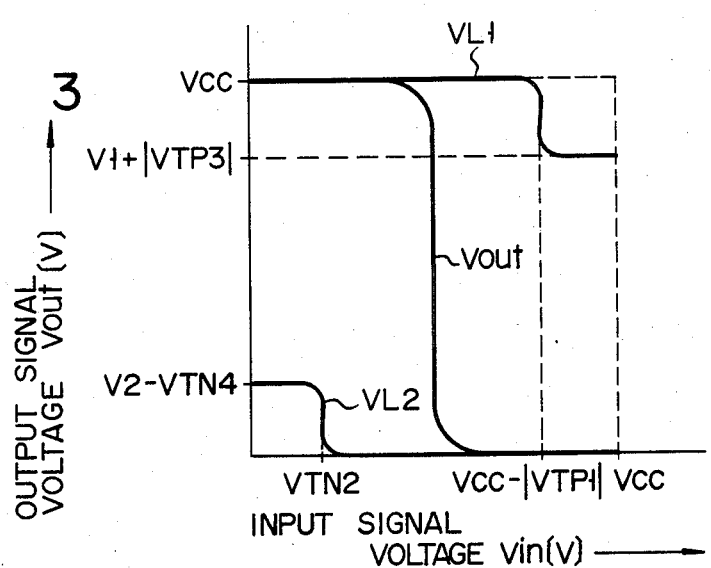
FIG. 3 is a graph showing the input-output characteristics of the circuit shown in FIG. 2, so as to explain the operation thereof.

The operation of the CMOS transmission circuit having the arrangement described above will now be described with reference to the input-output characteristic curves shown in FIG. 3. Assume that the voltage Vin of the input signal IN is set at 0 V. The MOS transistor T1 is kept in the ON state, and the MOS transistor T2 is kept in the OFF state. A voltage VL1 at the first transmission line L1 is set at the Vcc level, and a source potential of the MOS transistor T3 increases to the Vcc level. The MOS transistor T3 is then turned on, so that a voltage (output signal voltage) Vout at the output terminal 1b moves to the Vcc level. In this case, a drain potential of the MOS transistor T3 increases to the Vcc level, so that a source-side potential (voltage VL2 at the second transmission line L2) of the MOS transistor T4 increases to the "V2−VTN4" level. In addition, upon an increase in voltage at the first transmission line L1, the second transmission line L2 is charged through the capacitor 5. Therefore, even if the drive capacities of the MOS transistors T3 and T4 are small, the second transmission line L2 can be quickly changed.

Next, assume that the input signal voltage Vin increases to establish "Vin=VTN2" for "VTN2=VTN4" (where VTN2 is the threshold voltage of the MOS transistor T2). The MOS transistor T2 is turned on, and the voltage VL2 at the second transmission line L2 becomes 0 V. Therefore, the source potential at the MOS transistor T4 also becomes 0 V, so that the MOS transistor T4 is turned on and the voltage Vout at the output terminal 1b decreases.

When the input signal voltage Vin further increases to establish "Vin=Vcc−|VTP1|" for "VTP1=VTP3" (where VTP1 is the threshold voltage of the MOS transistor T1), the MOS transistor T1 is turned off, thereby discharging the potential VL1 of the transmission line L1 through the capacitor 5 and the MOS transistor T2, the MOS transistors T3 and T4, and the transmission line L2 and the MOS transistor T2. The potential VL1 decreases to the "V1+|VTP3|" level. The voltage Vout at the output terminal 1b become 0 V. The charges of the transmission line L1 are discharged from the side of the capacitor 5 and the side of the MOS transistors T3 and T4, so that the MOS transistors T3 and T4 can have a small drive capacity.

When "Vin=Vcc" is established, the MOS transistor T1 is held in the OFF state, the MOS transistor T2 is held in the ON state, the MOS transistor T3 is held in the OFF state, and the MOS transistor T4 is held in the ON state. Therefore, the voltage Vout at the output terminal 1b become 0 V.

The voltages VL1 and VL2 at the first and second transmission lines L1 and L2 change within the ranges given by the inequalities (3) and (4) below, so that the output signal voltage Vout changes within the range of 0 V to Vcc (full range of the power supply voltage) in accordance with changes in the input signal voltage Vin.

$$V1 + |VTP3| < VL1 < Vcc \quad (3)$$

$$0 < VL2 < V2 - VTN4 \quad (4)$$

Since the changes in amplitudes of voltages at the first and second transmission lines L1 and L2 are small, the time required for discharging the parasitic capacitances C1 and C2 is short, thereby allowing high-speed signal transmission. In addition, the parasitic capacitances c1 and C2 will not be subjected to charging/discharging by the full range of the power supply voltage. Therefore, power consumption can be decreased by an amount corresponding to the decreases in amplitudes of the voltages at the transmission lines.

Figure 4:
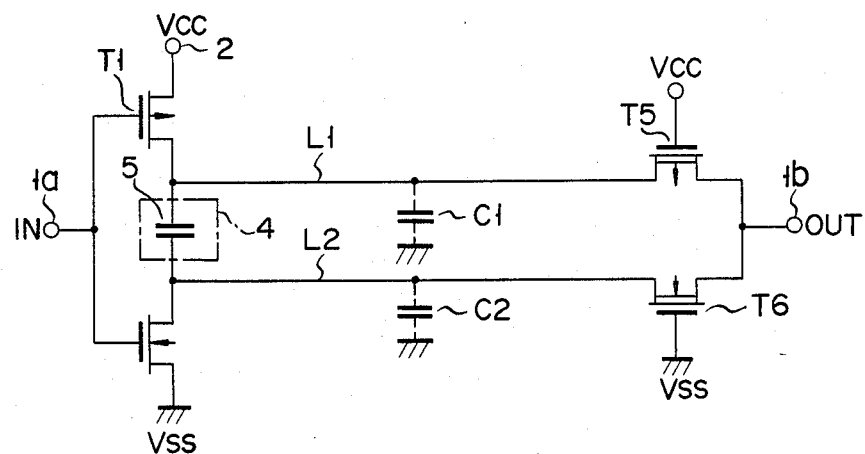
FIG. 4 is a circuit diagram of a CMOS transmission circuit according to another embodiment of the present invention.

FIG. 4 shows another embodiment of the present invention. The circuit shown in FIG. 2 has enhancement type transistors as the voltage limiting MOS transistors T3 and T4. However, in the circuit shown in FIG. 4, depletion type MOS transistors T5 and T6 are used in place of the MOS transistors T3 and T4 in FIG. 2. The MOS transistor T5 can be rendered conductive in response to the power supply voltage Vcc, and the MOS transistor T6 can be rendered conductive in response to the ground potential (Vss). The same reference numerals as used in FIG. 2 denote the same parts in FIG. 4, and a detailed description thereof will thus be omitted.

Figure 5:
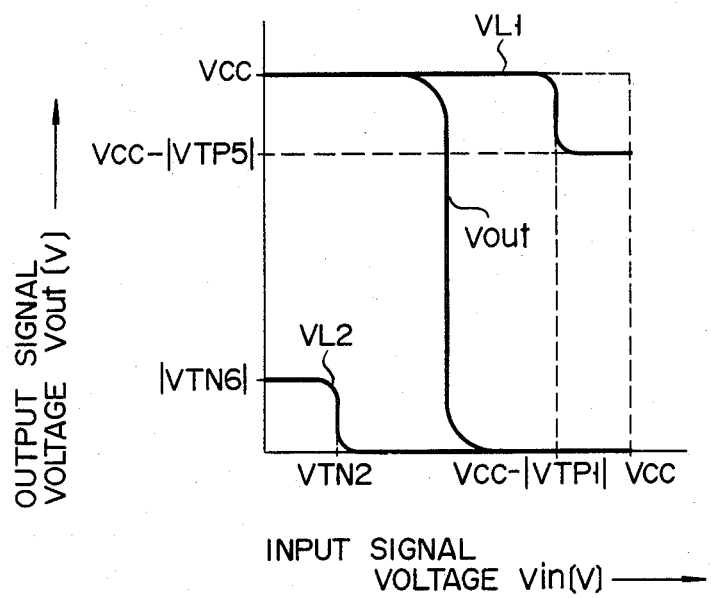
FIG. 5 is a graph showing the input-output characteristics of the circuit shown in FIG. 4, so as to explain the operation thereof.

In the arrangement described above, the circuit operation can be performed in a similar manner to that of the circuit shown in FIG. 2. The input-output characteristics of the circuit shown in FIG. 4 are illustrated in FIG. 5. Referring to FIG. 5, reference symbol VTP5 denotes a threshold voltage of the p-channel MOS transistor T5, and VTN6 denotes a threshold voltage of the n-channel MOS transistor T6.

According to the circuit shown in FIG. 4, the Vcc power supply voltage is used as the first reference voltage V1, and the Vss power supply voltage (ground potential) is used as the second reference voltage V2. Therefore, two reference voltage generators can be omitted.

Figure 6:
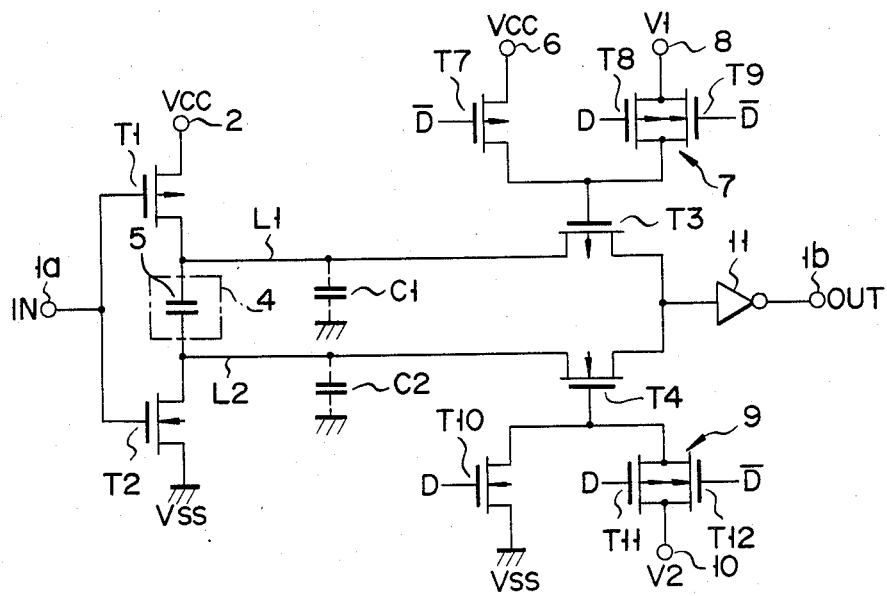
FIG. 6 is a circuit diagram of a CMOS transmission circuit according to still another embodiment of the present invention.

FIG. 6 shows still another embodiment of the present invention. The same reference numerals as used in FIG. 2 denote the same parts in FIG. 6, and a detailed description thereof will thus be omitted. The gate of a MOS transistor T3 is connected to a power supply terminal 6 through a p-channel enhancement type MOS transistor T7, whose conduction operation is controlled in response to a control signal $\overline{D}$. The power supply terminal 6 receives a power supply voltage Vcc. The gate of the MOS transistor T3 is also connected to a terminal 8 through a transmission gate 7. The transmission gate 7 consists of a p-channel enhancement type MOS transistor T8, whose conduction operation is controlled in response to a control signal D, and an n-channel enhancement type MOS transistor T9, whose conduction operation is controlled in response to the control signal $\overline{D}$. The terminal 8 receives a first reference voltage V1. The gate of the MOS transistor T4 is grounded (Vss) through an n-channel enhancement type MOS transistor T10, whose conduction operation is controlled in response to the control signal D. The gate of the MOS transistor T4 is also connected to a terminal 10 through a transmission gate 9. The transmission gate 9 consists of a p-channel enhancement type MOS transistor T11, whose conduction operation is controlled in response to the control signal D, and an n-channel enhancement type MOS transistor T12, whose conduction operation is controlled in response to the control signal $\overline{D}$. The terminal 10 receives a second reference voltage V2. The common node between the MOS transistors T3 and T4 is connected to the input terminal of an inverter 11. The output terminal of the inverter 11 is connected to an output terminal 1b at which an output signal OUT appears.

In the circuit having the arrangement described above, while the control signal D is set at a low level and the control signal $\overline{D}$ is set at a high level, the transmission gates 7 and 9 are kept in the ON state. The reference voltages V1 and V2 are applied to the gates of the MOS transistors T3 and T4, respectively. Therefore, the circuit shown in FIG. 6 performs the same operation as that shown in FIG. 2, thereby obtaining the output signal OUT through the inverter 11. However, when the control signal D is set at a high level and the control signal $\overline{D}$ is set at a low level, the transmission gates 7 and 9 are turned off, and the MOS transistors T7 and T10 are turned on. The power supply voltage Vcc and the ground potential (Vss) are applied to the gates of the MOS transistors T3 and T4, respectively, so that the transistors T3 and T4 are turned off, thereby stopping data transmission through the first and second transmission lines.

According to the arrangement described above, the MOS transistors T3 and T4 can be used not only as level shifters but also as transfer gates. The amplitudes of gate voltages of the MOS transistors T3 and T4 are given to be |V1−Vcc| and |V2−Vss|, respectively, so that these amplitudes are smaller than the power supply voltage Vcc. As a result, the ON/OFF operation of the MOS transistors T3 and T4 can be controlled at high speed. This high-speed operation is effective when a plurality of transfer gates are to be simultaneously turned on/off.

In the embodiments described above, the capacitor 5 is used as the constant voltage circuit 4. However, instead of incorporating the constant voltage circuit 4, the drain of the MOS transistor T1 can be connected only to the start point of the transmission line L1, and the drain of the MOS transistor T2 can be connected only to the start point of the transmission line L2. In this case, the prescribed effect can still be obtained. Note that, in this case, the MOS transistors T3 and T4 comprise transistors which have a large drive capacity.

Figure 7:
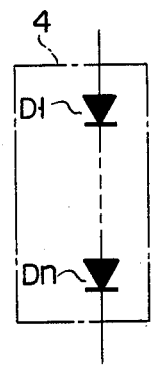
FIGS. 7 to 9 are circuit diagrams showing different arrangements of constant voltage circuits in the embodiments of the present invention.
Figure 8:
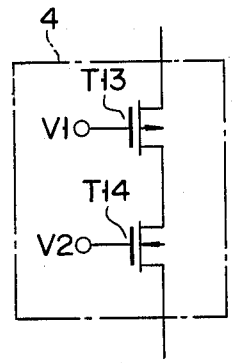
Figure 9:
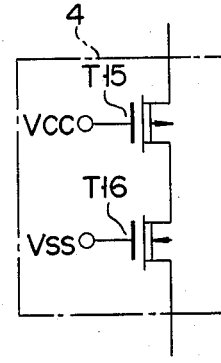

Constant voltage circuits shown in FIGS. 7, 8, and 9 may be used as the constant voltage circuit 4. Referring to FIG. 7, a constant voltage circuit 4 comprises series-connected diode D1, ... , and Dn. According to this arrangement, a current supply capacity can be increased to be greater than the capacity of the capacitor 5, so that a higher transmission operation can be performed. Referring to FIG. 8, a constant voltage circuit 4 comprises a series circuit of a p-channel enhancement type MOS transistor T13, whose conduction operation is controlled in response to the first reference voltage V1, and an n-channel enhancement type MOS transistor T14, whose conduction operation is controlled in response to the second reference voltage V2. In this arrangement, a higher packing density can be achieved than in the case wherein the constant voltage circuit comprises a capacitor or diodes. On the other hand, referring to FIG. 9, a constant voltage circuit 4 comprises a series circuit of a p-channel depletion type MOS transistor T15, whose conduction operation is controlled in response to the power supply voltage Vcc, and an n-channel depletion type MOS transistor T16, whose conduction operation is controlled in response to the ground potential Vss. According to this arrangement, the two reference voltage generators for generating the reference voltages V1 and V2 shown in FIG. 8 can be omitted. In particular, when this arrangement is combined with the circuit shown in FIG. 4, the manufacturing process can be simplified.

What is claimed is:

1. A CMOS transmission circuit comprising:
an input terminal which receives an input signal;
a first voltage source;
a second voltage source;
an enhancement type first MOSFET of a first conductivity type which has a gate connected to said input terminal, a first terminal connected to said first voltage source, and a second terminal;
a second enhancement type MOSFET of a second conductivity type which has a gate connected to said input terminal, a first terminal connected to said second voltage source, and a second terminal;
a constant voltage circuit electrically connected between the second terminal of said first MOSFET and the second terminal of said second MOSFET;
a first transmission line which has a start point connected to the second terminal of said first MOSFET, and an end point;
an output terminal for outputting an output signal;
a third enhancement type MOSFET of a first conductivity type which has a first terminal connected to the end point of said first transmission line, a second terminal connected to said output terminal, and a gate;
a first reference voltage terminal connected to the gate of said third MOSFET and supplied with a first reference voltage which is higher than the potential of said second voltage source and lower than a voltage value obtained by subtracting the absolute value of the threshold voltage of said third MOSFET from the potential of said first voltage source;
a second transmission line which has a start point connected to the second terminal of said second MOSFET, and an end point;
a fourth enhancement type MOSFET of a second conductivity type which has one terminal connected to the end point of said second transmission line, a second terminal connected to said output terminal, and a gate; and
a second reference voltage terminal connected to the gate of said fourth MOSFET and supplied with a second reference voltage which is higher than a threshold voltage of said fourth MOSFET and greater than the potential of said second voltage source.

2. A transmission circuit according to claim 1, wherein said constant voltage circuit comprises a capacitor.

3. A transmission circuit according to claim 1, wherein said constant voltage circuit comprises a plurality of series-connected diodes.

4. A transmission circuit according to claim 1, wherein said constant voltage circuit comprises an enhancement type MOSFET of a first conductivity type, rendered conductive in response to the first reference voltage, and an enhancement type MOSFET of a second conductivity type, connected in series to said first conductivity type MOSFET and rendered conductive in response to the second reference voltage.

5. A transmission circuit according to claim 1, wherein said constant voltage circuit comprises a depletion type MOSFET of a first conductivity type, rendered conductive in response to the first voltage source, and a depletion type MOSFET of a second conductivity type, connected in series to said first conductivity type MOSFET and rendered conductive in response to the second voltage source.

6. A transmission circuit according to claim 1, which further comprises: a fifth MOSFET having one terminal connected to said gate of said fourth MOSFET, the other terminal connected to said second voltage source, and a gate which receives a control signal; a first transmission gate, arranged between said gate of said fourth MOSFET and said second reference voltage terminal, which is controlled in response to the control signal and the inverted signal thereof; a sixth MOSFET having one terminal connected to said gate of said third MOSFET, the other terminal connected to said first voltage source, and a gate which receives the inverted signal of said control signal; and a second transmission gate, arranged between said gate of said third MOSFET and said first reference voltage terminal, which is controlled in response to the control signal and the inverted signal thereof.

7. A CMOS transmission circuit comprising:
   an input terminal which receives an input signal;
   a first voltage source;
   a second voltage source;
   an enhancement type first MOSFET of a first conductivity type which has a gate connected to said input terminal, one terminal connected to said first voltage source, and a second terminal;
   an enhancement type second MOSFET of a second conductivity type which has a gate connected to said input terminal, one terminal connected to said second voltage source, and a second terminal;
   a constant voltage circuit electrically connected between the second terminal of said first MOSFET and the second terminal of said second MOSFET;
   a first transmission line which has a start point connected to the second terminal of said first MOSFET, and an end point;
   an output terminal for outputting an output signal;
   a depletion type third MOSFET of a first conductivity type which has one terminal connected to the end point of said first transmission line, a second terminal connected to said output terminal, and a gate;
   a first reference voltage terminal connected to the gate of said third MOSFET and supplied with a first reference voltage which is higher than the absolute value of the threshold voltage of said third MOSFET and lower than or equal to the potential of said first voltage source;
   a second transmission line which has a start point, connected to the second terminal of said second MOSFET, and an end point;
   a depletion type fourth MOSFET of a second conductivity type which has one terminal connected to the end point of said second transmission line, a second terminal connected to said output terminal, and a gate;
   a second reference voltage terminal connected to the gate of said fourth MOSFET and supplied with a second reference voltage which is higher than or equal to the potential of said second voltage source and lower than a value obtained by subtracting the absolute value of the threshold voltage of said fourth MOSFET from the potential of said first voltage source.

8. A transmission circuit according to claim 7, wherein said constant voltage circuit comprises a capacitor.

9. A transmission circuit according to claim 7, wherein said constant voltage circuit comprises a plurality of series-connected diodes.

10. A transmission circuit according to claim 7, wherein said constant voltage circuit comprises an enhancement type MOSFET of a first conductivity type, rendered conductive in response to the first reference voltage, and an enhancement type MOSFET of a second conductivity type, connected in series to said first conductivity type MOSFET and rendered conductive in response to the second reference voltage.

11. A transmission circuit according to claim 7, wherein said constant voltage circuit comprises a depletion type MOSFET of a first conductivity type, rendered conductive in response to the first voltage source, and a depletion type MOSFET of a second conductivity type, connected in series to said first conductivity type MOSFET and rendered conductive in response to the second voltage source.

12. A CMOS transmission circuit comprising:
   an input terminal which receives an input signal;
   a first voltage source;
   a second voltage source;
   an enhancement type first MOSFET of a first conductivity type which has a gate connected to said input terminal, one terminal connected to said first voltage source, and a second terminal;
   an enhancement type second MOSFET of a second conductivity type which has a gate connected to said input terminal, one terminal connected to said second voltage source, and a second terminal;
   a first transmission line which has a start point connected to the second terminal of said first MOSFET, and an end point;
   an output terminal for outputting an output signal;
   an enhancement type third MOSFET of a first conductivity type which has one terminal connected to the end point of said first transmission line, a second terminal connected to said output terminal, and a gate;
   a first reference voltage terminal connected to the gate of said third MOSFET and supplied with a first reference voltage which is higher than the potential of said second voltage source and lower than a value obtained by subtracting the absolute value of the threshold voltage of said third MOSFET from the potential of said first voltage source;
   a second transmission line which has a start point, connected to the second terminal of said second MOSFET, and an end point, and is arranged so as to produce a parasitic capacitance between said first and second transmission lines;
   an enhancement type fourth MOSFET of a second conductivity type which has one terminal connected to the end point of said second transmission line, a second terminal connected to said output terminal, and a gate; and
   a second reference voltage terminal connected to the gate of said fourth MOSFET and supplied with a second reference voltage which is higher than the threshold voltage of said fourth MOSFET and greater than the potential of said second voltage source.

13. A transmission circuit according to claim 12, which further comprises: a fifth MOSFET having one terminal connected to said gate of said fourth MOSFET, a second terminal connected to said second voltage source, and a gate which receives a control signal; a first transmission gate, arranged between said gate of said fourth MOSFET and said second reference voltage terminal, which is controlled in response to the control signal and the inverted signal thereof; a sixth MOSFET having one terminal connected to said gate of said third MOSFET, a second terminal connected to said first voltage source, and a gate which receives the inverted signal of said control signal; and a second transmission gate, arranged between said gate of said third MOSFET and said first reference voltage terminal, which is controlled in response to the control signal and the inverted signal thereof.

14. A CMOS transmission circuit comprising:
an input terminal which receives an input signal;
a first voltage source;
a second voltage source;
an enhancement type first MOSFET of a first conductivity type which has a gate connected to said input terminal, one terminal connected to said first voltage source, and a second terminal;
an enhancement type second MOSFET of a second conductivity type which has a gate connected to said input terminal, one terminal connected to said second voltage source, and a second terminal;
a first transmission line which has a start point connected to the second terminal of said first MOSFET, and an end point;
an output terminal for outputting an output signal;
a depletion type third MOSFET of a first conductivity type which has one terminal connected to the end point of said first transmission line, a second terminal connected to said output terminal, and a gate;
a first reference voltage terminal connected to the gate of said third MOSFET and supplied with a first reference voltage which is higher than the absolute value of the threshold voltage of said third MOSFET and lower than or equal to the potential of said first voltage source;
a second transmission line which has a start point, connected to the other terminal of said second MOSFET, and an end point, and is arranged so as to produce a parasitic capacitance between said first and second transmission lines;
a depletion type fourth MOSFET of a second conductivity type which has one terminal connected to the end point of said second transmission line, a second terminal connected to said output terminal, and a gate; and
a second reference voltage terminal connected to the gate of said fourth MOSFET and supplied with a second reference voltage which is greater than or equal to the potential of said second voltage source and lower than a value obtained by subtracting the absolute value of the threshold voltage of said fourth MOSFET from the potential of said first voltage source.

* * * * *